United States Patent
Schneider et al.

(10) Patent No.: US 6,443,171 B1
(45) Date of Patent: Sep. 3, 2002

(54) EXHAUST APPARATUS

(75) Inventors: Germar Schneider, Dresden (DE); Pierre-Louis Saez, Coudray-Montceaux (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/504,274

(22) Filed: Feb. 15, 2000

(30) Foreign Application Priority Data

Feb. 15, 1999 (DE) .......................................... 199 06 224

(51) Int. Cl.[7] .............................. B08B 3/00; B08B 9/00
(52) U.S. Cl. ............... 134/166 C; 134/171; 134/166 R; 134/902
(58) Field of Search ....................... 134/21, 22.1, 22.11, 134/166 R, 166 C, 171, 201, 902

(56) References Cited

U.S. PATENT DOCUMENTS

| 4,634,312 A | * | 1/1987 | Sterzel | 134/166 C |
| 4,899,770 A | * | 2/1990 | Wilson | 134/166 C |
| 5,415,585 A | * | 5/1995 | Miyagi | 422/152 |
| 5,747,775 A | * | 5/1998 | Tsukamoto et al. | 219/400 |
| 5,879,139 A | * | 3/1999 | Hayashi et al. | 415/176 |
| 5,972,078 A | * | 10/1999 | Collins et al. | 118/61 |

* cited by examiner

Primary Examiner—Alexander Markoff
Assistant Examiner—Joseph Perrin
(74) Attorney, Agent, or Firm—Laurence A. Greenberg; Werner H. Stemer; Ralph E. Locher

(57) ABSTRACT

An exhaust apparatus for a treatment unit of electrical components, preferably wafers, particularly for a spray tool to clean electrical components, is described. To ensure that particles of a size greater than or equal to 0.16 μm in diameter can be reliably removed from the treatment unit, which particles would otherwise cause contamination of the electrical components, the exhaust apparatus is provided with a main exhaust pipe and a side pipe. The main exhaust pipe has an outside pipe and an inside pipe, whereby the inside pipe is equipped with a number of nozzles. The side pipe connects the treatment unit with the main exhaust pipe and which has an outside pipe and an inside pipe, whereby the inside pipe is equipped with a number of nozzles. The inside pipes are connected with a source of a cleaning fluid such that the cleaning fluid at least intermittently flows through the inside pipes for the purpose of rinsing. The side pipe and the main exhaust pipe are connected with each other at a certain angle. Furthermore, the side pipe is made of several partial areas that are aligned at a certain angle with respect to each other. Furthermore, an additional exhaust pipe, which connects the main exhaust pipe with a clean room, is provided.

34 Claims, 3 Drawing Sheets

EXHAUST APPARATUS

BACKGROUND OF THE INVENTION

Field of the Invention

The present invention relates to an exhaust apparatus for a treatment unit for electrical components, preferably wafers, and, in particular, an exhaust apparatus for a spray tool to clean electrical components, whereby the particles located in the treatment unit are removed by suction. The invention furthermore relates to a system for treating electrical components. Finally, the invention also relates to a process for the removal by suction and/or rinsing of particles from a treatment unit of such a system.

The semiconductor industry frequently uses chemical spray tools to remove organic and inorganic contaminants from the very small chip structures that today have structural widths of 0.20 μm. The wafers become contaminated, for example, during the treatment process, e.g., in the plasma etching process used to produce the microstructures or the like, where difficult-to-remove organic polymers are created. Furthermore, e.g. after photolithographic steps, the silicon wafers must be cleaned of coating residues, which may be accomplished by spray tools.

The spray tools generally contain a carrier for the wafers, which in turn is located within a sealed housing. The process chemicals or chemical mixtures required for cleaning are sprayed through spray nozzles from the top or from the side onto the wafer surface.

In addition to cleaning the wafer surfaces of organic and inorganic contaminants, the removal of particles, such as dust particles from the clean room, also plays an important role. With chip structure widths of less than 0.4 μm, which are found, for instance, in the 16 MB DRAM chip, particles with a diameter greater than 0.16 μm may result in component failure. To ensure that the treatment unit itself does not cause particle contamination requires monitoring for particles greater than 0.16 μm diameter and their removal from the treatment unit.

Monitoring is not possible in conventional exhaust apparatuses for this type of spray tool, or treatment unit in general, which is made of polypropylene. Randomly occurring particle contamination frequently causes high defect densities on wafers and, not least of all, wafer reject rates, and thus results in production down time of the spray tool.

SUMMARY OF THE INVENTION

It is accordingly an object of the invention to provide an exhaust apparatus and method of operating an exhaust apparatus which overcome the above-mentioned disadvantages of the prior art devices and methods of this general type, in which comprehensive cleaning of the electrical components in the corresponding treatment units even if cleaning from particles as small as 0.16 μm in diameter is required, is ensured.

With the foregoing and other objects in view there is provided, in accordance with the invention, an exhaust apparatus for a treatment unit for treating electrical components including wafers, the exhaust apparatus removing by at least one of suction and rinsing, particles located in the treatment unit, the exhaust apparatus containing:

a main exhaust pipe having an outside pipe and an inside pipe with a number of nozzles formed therein;

a side pipe having an outside pipe, an inside pipe with a number of nozzles formed therein, a first end to be connected to the treatment unit, and a second end connected to the main exhaust pipe; and a storage tank containing a cleaning fluid connected to the inside pipe of the main exhaust pipe and the inside pipe of the side pipe such that the cleaning fluid at least intermittently flows through the inside pipe of the main exhaust pipe and the inside pipe of the side pipe.

According to a first aspect of the invention, the object is attained in that the exhaust apparatus serves to remove particles located in the treatment unit by suction. According to the invention, the exhaust apparatus contains the main exhaust pipe that is provided with an outside pipe and an inside pipe, with the inside pipe having a number of nozzles, and the side pipe that connects the treatment unit with the main exhaust pipe and is provided with an outside pipe and an inside pipe, with the inside pipe having a number of nozzles. The inside pipes are connected with a source for cleaning fluid so that a cleaning fluid at least intermittently flows through the inside pipes.

The exhaust apparatus according to the invention permits monitoring and removal by suction of particles greater than or equal to 0.16 μm in diameter so that particle contamination of the treatment unit and the electrical components with the aforementioned disadvantages is prevented.

The cleaning fluid is injected into the main exhaust pipe and the side pipe through the nozzles of the inside pipes so that these pipes can be rinsed with the cleaning fluid. This prevents contamination of the electrical components with particles originating from the exhaust apparatus. The inside pipes are suitably connected with the source of the cleaning fluid, which is stored in a suitable tank, for example, by corresponding lines.

Rinsing or cleaning is advantageously conducted after completion of a treatment process in the treatment unit and will be described in further detail below.

Application of the exhaust apparatus according to the invention is not limited to specific treatment units. Rather, it may be used wherever electrical components are sprayed with materials and where such spray materials must be subsequently removed by suction. An advantageous example is the application of the exhaust apparatus in a spray tool for cleaning wafers.

According to the invention, the side pipe can have an outside pipe with a 90 mm diameter and/or an inside pipe with a 20 mm diameter. The invention is of course not limited to the above diameters.

In a further embodiment, the side pipe can be formed of two or more partial areas. The partial areas are advantageously aligned at an angle with respect to each other. The angled embodiment of the side pipe further reduces the risk of particles entering the treatment unit from the side pipe. The angled side pipe can be configured as one piece or several pieces. In the latter case, the individual partial areas are produced first and are then assembled into the side pipe.

The partial areas are preferably aligned with respect to each other at an angle of between 135° and 155°, preferably between 140° and 145°, particularly at an angle of 142° 30'.

According to the invention, at least one of the edge-side partial areas of the side pipe may be connected with an extension element. Using one or several of the extension elements makes it possible to take into account the structural conditions, including the different distances between the treatment unit and the main exhaust pipe. If an extension element is used, the inside pipe is preferably also extended so that the extension element can also be rinsed with the cleaning fluid.

In a further embodiment, the main pipe is provided with an inside pipe with a diameter of 25 mm. Here, too, the diameter can be varied as required.

The pressure of the gas phase within the main exhaust pipe is preferably set within a range of 2.03 cm (0.8 inches) to 4.3 cm (1.7 inches)/water column, preferably at 3.81 cm (1.5 inches)/water column.

The main exhaust pipe and the side pipe are preferably connected with each other at an angle of 25° to 40°, preferably 30°. This angled configuration is important for the exhaust apparatus according to the invention, since it further improves the cleaning effect and prevents particle contamination.

In a further embodiment, the main exhaust pipe is connected with an additional exhaust pipe, whereby the exhaust pipe is connected or connectable with a clean room. The additional exhaust pipe is used to draw in air for the suction process within the exhaust apparatus. Drawing air out of the clean room, which has the result that the air quality is that of clean room Class 1 or better, ensures that no particles can be diffused back into the exhaust apparatus through the exhaust pipe. Furthermore, intake of clean room air via the exhaust pipe has the purpose of equalizing the pressure of the cleaning fluid within the main exhaust pipe.

According to the invention, the main exhaust pipe may be connected with a gas scrubber. The gas scrubber, kept under a constant flow of, for example, 5 liters/minute of cleaning fluid, prevents acid or basic gases from being released into the environment. Furthermore, it protects the treatment unit from any back flow of particles from the ventilation system of the exhaust apparatus.

In a further embodiment, the nozzles within the inside pipe can be spaced 5 to 20 cm apart. The appropriate distance between the nozzles is a function of the diameter of the side pipe and the main exhaust pipe as well as of the amount of cleaning fluid required for full rinsing of the pipes.

Advantageously, 10 to 15, preferably 11 nozzles can be disposed in each of the inside pipes. Depending on the requirements, e.g., if an extension element or similar is used, a different number of nozzles may be appropriate.

According to the invention, the nozzles can have 1 to 10 nozzle openings that are preferably formed across the circumference of the inside pipe. The nozzle openings can have a diameter of, for example, 0.3 mm to 1.0 mm. Preferred nozzle opening diameters range from 0.5 mm to 0.7 mm. The selected diameter of the nozzle openings depends, among other things, on the number of nozzle openings per nozzle. In a preferred embodiment, for example, 1, 3 or 10 nozzle openings per nozzle can be provided. The number of nozzle openings depends, in particular, on the geometry of the pipes to be rinsed as well as on the areas of the pipes that are to be reached by the cleaning fluid. 10 nozzle openings distributed at a single position of the inside pipe over the entire pipe circumference at that location permit uniform rinsing of, for example, the side pipe or the main exhaust pipe over its entire cross section.

In a further embodiment, the side pipe and/or the exhaust pipe can be made of PVDF plastic (polyvinylidene fluoride) or another chemically inert plastic. This special material further reduces possible particle contamination.

The main exhaust pipe can advantageously be made of PVC plastic (polyvinyl chloride) or some other plastic. In particular, the main exhaust pipe can also be made of PVDF plastic.

According to the invention, the cleaning fluid may be DI water (deionized or demineralized water). The use of DI water provided with wetting agent compositions is also advantageous. Depending on the application, other cleaning fluids with specific chemical compositions may be used.

According to a second aspect of the present invention, a system is provided for treating electrical components, preferably wafers, with at least one treatment unit for treating the electrical components, particularly the spray tool for cleaning the electrical components, and with an exhaust apparatus according to the invention as described above.

With such a system, the electrical components can be cleaned in a simple manner sufficiently thoroughly that contamination with particles greater than or equal to 0.16 $\mu$m in diameter is almost completely prevented, particularly limited to a maximum of ten additional particles on 200 mm wafers. This makes it possible substantially to reduce the reject rates of the electrical components as well as any downtimes of the system.

In principle, the system according to the invention can be used to treat any type of electrical component. However, the system is preferably used to treat microelectronic components, wafers or the like.

One or several treatment units, connected with the same or with different exhaust apparatuses, may be provided per system.

Since the specially configured exhaust apparatus is an essential feature of the system, full reference is herewith made to the above statements regarding the exhaust apparatus with respect to the advantages, actions, effects and mode of operation of the system according to the invention.

According to the invention, the treatment unit can be disposed within a clean room, while the exhaust apparatus can be disposed outside the clean room. This allows the clean room to be kept as small as possible. It also permits any work on the exhaust apparatus to be carried out without contaminating the atmosphere of the clean room. Of course, the exhaust apparatus can also be disposed within the clean room with appropriate clean room protective measures.

In a further embodiment, the main exhaust pipe of the exhaust apparatus is connected with the clean room via the exhaust pipe resulting in the aforementioned advantageous effects.

According to the invention, the main exhaust pipe can be connected to a chimney. Through the chimney, the particles that are removed by suction from the treatment unit can be released to the outside. To prevent harmful gases from being released into the environment, the main exhaust pipe is preferably connected to the chimney via the gas scrubber.

Advantageously, each of the treatment units is directly connected with the chimney via an additional, separate exhaust. This makes it possible to prevent even more completely any particle back flow into the treatment chamber of the treatment unit.

In a further embodiment, a motor may be provided to support the suction process. This motor, which may be set, for example, at 8 m/second, regulates the exhaust flow from the side pipe and the main exhaust pipe to the chimney.

According to the invention, the system can be used to clean wafers, particularly to clean wafers from particles greater than or equal to 0.16 $\mu$m.

The exhaust apparatus according to the invention as well as the system according to the invention are particularly suitable for hot chemical processes, for example, the removal of photoresist residue with concentrated sulfuric acid mixtures, during which spray chamber temperatures in excess of 100° C. occur and result in the corrosion of plastic parts. Furthermore, the exhaust apparatus is excellently suited for processes where particles are created in the gas phase by a chemical reaction, for example, salt formation, which would contaminate the electrical components, such as wafers, through back flow. The exhaust apparatus and the system are also particularly suitable for processes using ammonia and hydrochloric acid (SC1/SC2 processes) to clean semiconductor structures from organic and inorganic contamination.

According to a third aspect of the present invention, a process is provided for the removal by suction and/or rinsing of particles from a treatment unit of a system to treat electrical components, preferably wafers, as described above, using an exhaust apparatus as described above, which according to the invention is characterized by the following steps:
  a) removing particles by suction from the treatment unit during the treatment process via the side pipe into the main exhaust pipe and guiding the removed particles to the chimney, preferably via the gas scrubber, whereby air from the clean room is drawn via the exhaust pipe into the main exhaust pipe to support the suction process;
  b) after completion of the treatment process, piping cleaning fluid into the inside pipes of the side pipe and the main exhaust pipe and injecting the cleaning fluid via the corresponding nozzles into the side pipe and the main exhaust pipe to rinse them; and
  c) discharging the cleaning fluid from the side pipe and the main exhaust pipe after completion of the rinsing process.

The process according to the invention permits cleaning of the electrical components and the treatment unit without the aforementioned contamination of the electrical components. Full reference is herewith again made to the above statements regarding the embodiments of the exhaust apparatus and the system with respect to the advantages, actions, effects and the mode of operation of the process.

At the end of a treatment cycle, the entire exhaust apparatus is flooded with cleaning fluid. This fact as well as the special embodiment of the exhaust apparatus and the system makes it possible to minimize contamination with particles greater than or equal to 0.16 $\mu$m.

The cleaning fluid used for cleaning can be discharged directly into an effluent channel located underneath the treatment unit.

Advantageously, rinsing of the side pipe and the main exhaust pipe can be accomplished over a period of 0.5 to 10 minutes, preferably 2 minutes. For extreme processes, continuous rinsing is also feasible.

According to the invention, the rinsing operation of the exhaust apparatus can be triggered by opening the cover in the treatment unit. This ensures that rinsing and cleaning start automatically and immediately after completion of the treatment process in the treatment unit.

To avoid contamination of the products by electrostatic charging of the plastic used in the system, the electrostatic charges may be compensated by using electrostatic deionizers for 1 to 5 minutes (ideally 2 minutes) at the end of each cleaning run. Depending on the spray tool or the treatment unit, 5 to 20 deionizers may be provided, which are disposed 1 to 20 cm apart from one another, preferably 10 cm apart, at a height of 0.5 to 5 m, preferably 1.5 m, above the chamber of the treatment unit. Deionization takes place automatically after the cover of the treatment unit has been opened. Subsequently, a countdown occurs, which gives the operator or an automatic unloading system the green light to unload the treatment unit after the deionization period has been completed.

Advantageously, the pressure of the gas phase in the main exhaust pipe is set at 2.03 cm (0.8 inches) to 4.4 cm (1.7 inches)/water column, preferably to 3.81 cm (1.5 inches)/water column.

According to the invention, the gas scrubber can be kept under a constant flow of cleaning fluid at 5 liters/minute.

Other features which are considered as characteristic for the invention are set forth in the appended claims.

Although the invention is illustrated and described herein as embodied in an exhaust apparatus and method of operating the exhaust apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
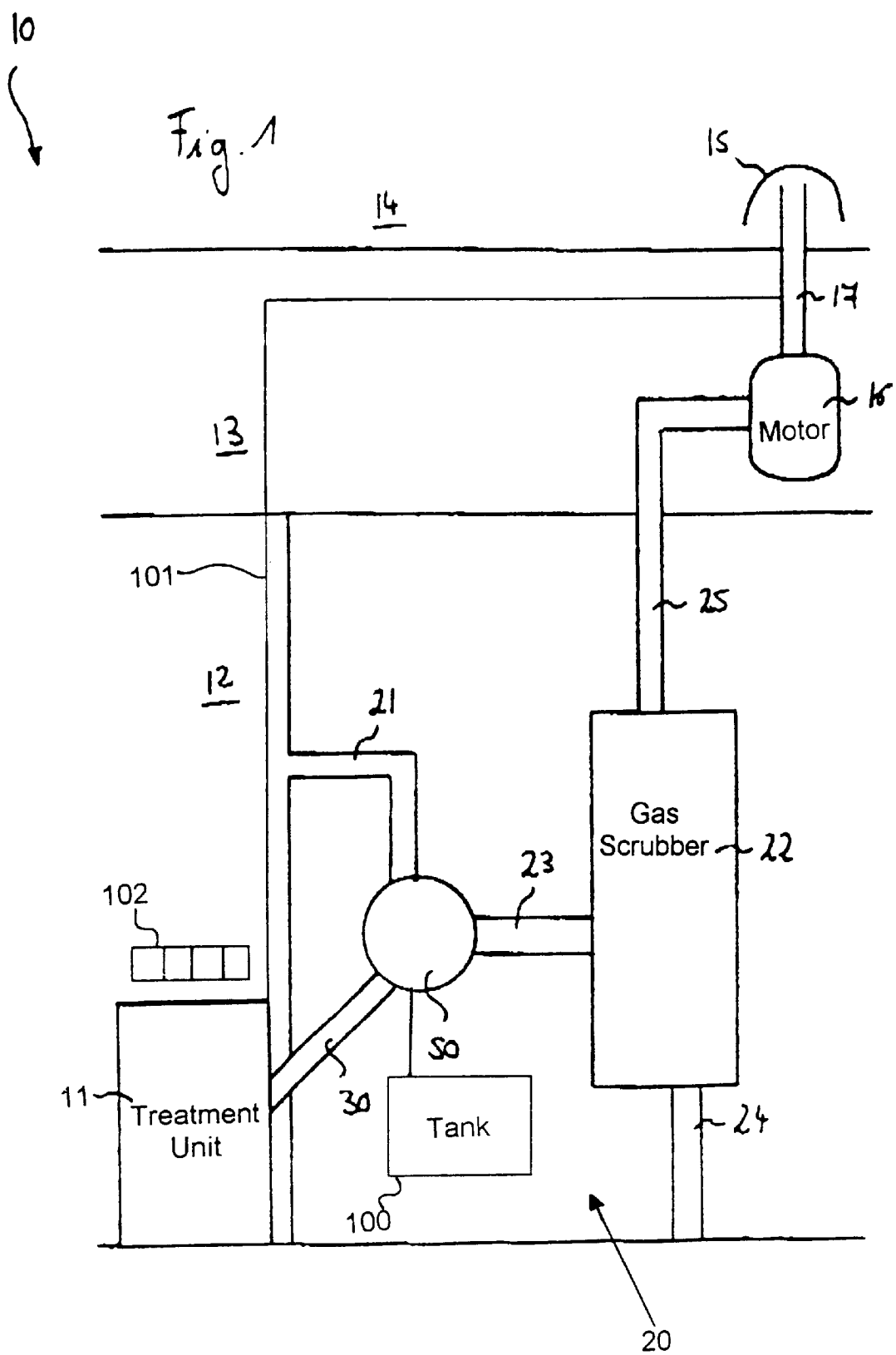
FIG. 1 is a diagrammatic view of a system for treating electrical components according to the invention.

In all the figures of the drawing, sub-features and integral parts that correspond to one another bear the same reference symbol in each case. Referring now to the figures of the drawing in detail and first, particularly, to FIG. 1 thereof, there is shown a system 10 for treating electrical components, preferably wafers. The system 10 has a treatment unit 11, which in this case is a spray tool for the chemical cleaning of wafers. The system 10 can have one or several of the spray tools 11. The spray tool 11 is disposed within a clean room 12. Outside the clean room 12, an exhaust apparatus 20 is provided to remove particles greater than or equal to 0.16 $\mu$m by suction from the spray tool 11. This is to prevent the aforementioned disadvantageous contamination of the wafers.

The exhaust apparatus 20 has a main exhaust pipe 50, which is connected via a side pipe 30 with the spray tool 11. Via the side pipe 30, the particles are removed by suction from the spray tool 11 and are guided into the main exhaust pipe 50. To support the suction process, an exhaust pipe 21 is furthermore provided, which is connected on the one side with the main exhaust pipe 50 and on the other side with the clean room 12. The intake of clean room air ensures that no harmful particles can diffuse back into the exhaust apparatus 20.

The main exhaust pipe 50 is furthermore connected via a pipe 23 with a gas scrubber 22 that is kept under a constant flow of demineralized water at 5 liters/minute. The gas scrubber 22 prevents the release into the environment of acid or basic gases that have been removed by suction.

The gas scrubber 22 is connected via an additional pipe 25 with a motor 16 located on an upper floor 13 of the system 10. The motor 16, set at 8 m/s, controls the discharge of removed gases to a chimney 15, which is disposed on a roof 14 of the system 10. The demineralized water is discharged from the gas scrubber 22 via a discharge pipe 24 from system 10.

The side pipe 30 and the exhaust pipe 21 are made of PVDF plastic, while the main exhaust pipe 50 is made of PVC plastic.

Figure 2:
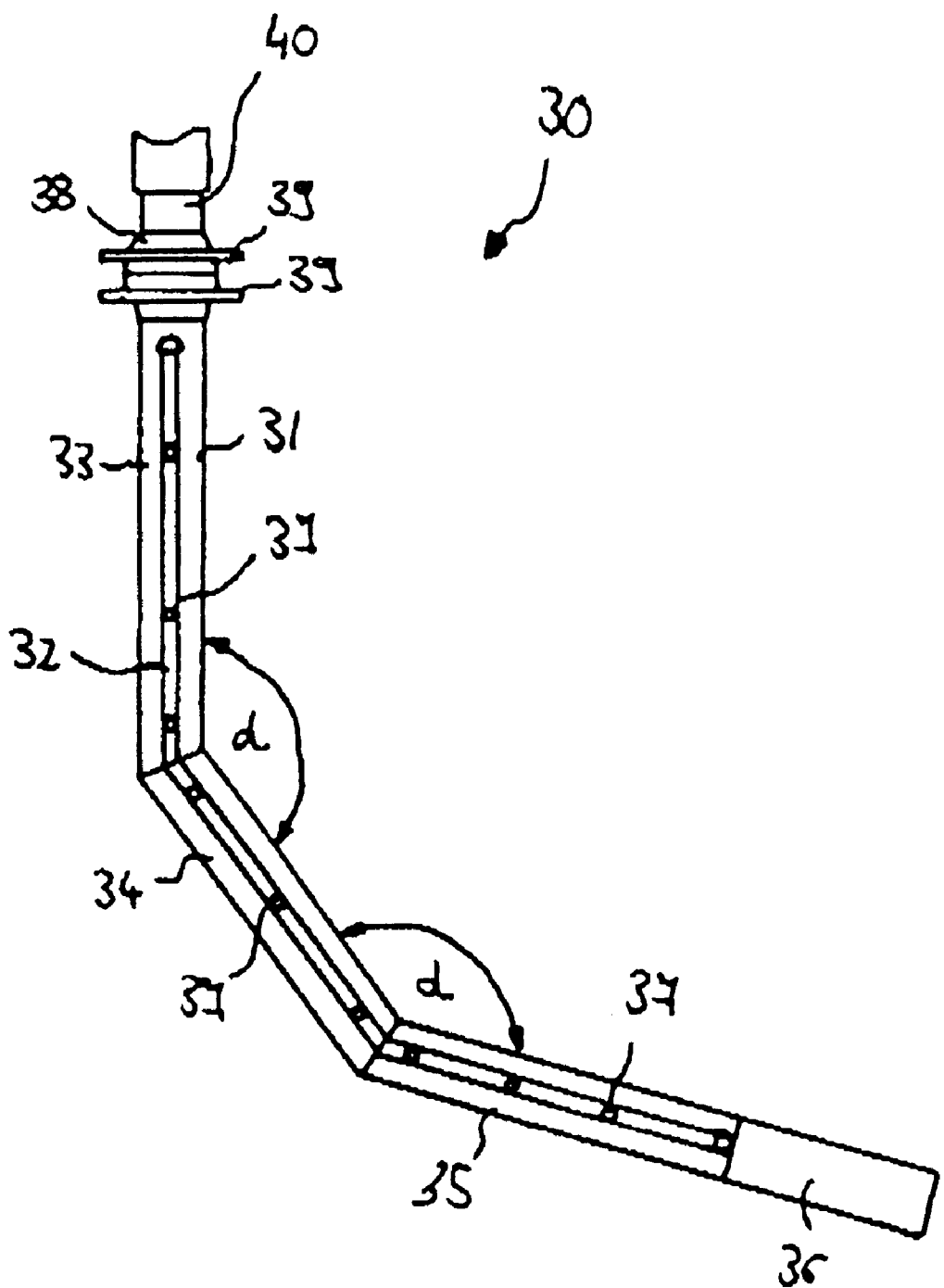
FIG. 2 is a side-elevational view of an exemplary embodiment of a side pipe.

The side pipe 30 is depicted in further detail in FIG. 2. As may be seen in FIG. 2, the side pipe 30 includes an outside pipe 31 with a diameter of 90 mm and an inside pipe 32 with a diameter of 20 mm.

The side pipe 30 has three partial areas, 33, 34 and 35, which are aligned with respect to each other at an angle α of 142° 30'.

To provide a simple connection of the side pipe 30 with the spray tool 11, an extension element 36 is provided on the partial area 35. Through the partial area 33, the side pipe 30 is connected with the main exhaust pipe 50. This connection is effected via a collar 38 and two clips 39 to ensure a secure and tight seat. Furthermore, a transparent connecting pipe 40 is provided.

The inside pipe 32 of the side pipe 30 has a total of 11 nozzles 37. The nozzles 37 are disposed in the partial area 33 spaced 20 cm apart and in each of the partial areas 34 and 35 spaced 5 cm apart. The nozzles 37 can have one, three or ten nozzle openings with a diameter of 0.5 mm. The individual nozzle openings of each of the nozzles 37 are distributed over the circumference of the inside pipe 32.

Figure 3:
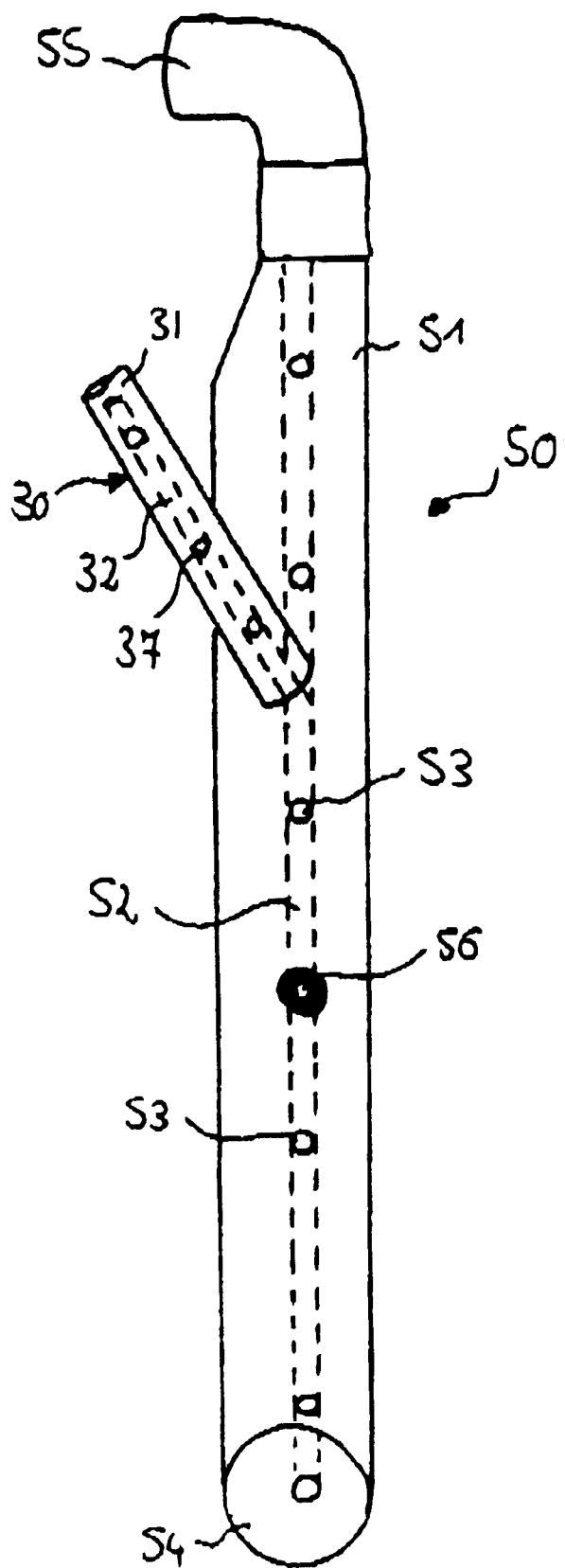
FIG. 3 is a top view of an exemplary embodiment of a main exhaust pipe.

FIG. 3 shows the main exhaust pipe 50 in greater detail. The main exhaust pipe 50 has an outside pipe 51 as well as an inside pipe 52 with a diameter of 25 mm. In the inside pipe 52, a total of 11 nozzles 53 are disposed, which are spaced 5 cm apart and can have a number of nozzle openings as described above.

The main exhaust pipe 50 is connected via a connection 54 with the exhaust pipe 21 and via a connection 55 with the motor 16 to support the suction process.

The main exhaust pipe 50 and the side pipe 30 are connected with each other at a 30° angle.

The inside pipes 32 and 52 are connected with a source (tank) 100 containing cleaning fluid, in this case, demineralized water. As shown in FIG. 3, the inside pipes 32 and 52 are also connected with each other so that only one incoming line for the source 100 of the cleaning fluid is required. The pressure of the gas phase in the main exhaust pipe 50 is set at 3.81 cm/water column. The pressure can be controlled via a pressure gauge, which is connected with the main exhaust pipe 50 via a connection 56.

Below the mode of operation of the system 10 is described.

During the wafer treatment process in the spray tool 11, all particles being created are removed by suction via the side pipe 30 into the main exhaust pipe 50 and from there are directed via the pipe 23 into the gas scrubber 22. Cleaning in the gas scrubber 22 as well as intake of clean room air via the exhaust pipe 21 prevents the particles from being diffused back into the spray tool 11. The exhaust gas cleaned in the gas scrubber 22 is drawn off via the motor 16 to the chimney 15 from where it is released into the environment. To improve particle suction from the spray tool 11, the latter can be connected with the chimney 15 via an additional, separate exhaust line 101.

After completion of the treatment process, a non-illustrated cover of the spray tool 11 is opened, which automatically starts up a rinsing process of the exhaust apparatus 20. At the same time, electrostatic charging is compensated by deionizers 102 (ionization barriers) above the opened cover. To rinse the exhaust apparatus 20, demineralized water as the cleaning fluid is piped into the inside pipes 32, 52 and is injected into the side pipe 30 and the main exhaust pipe 50 via the nozzles 37, 53. This rinses the side pipe 30 and the main exhaust pipe 50 so that no particles can get back into the spray tool 11. The rinsing process is conducted for a period of two minutes. The outflowing demineralized water is led directly into an effluent channel, which is formed underneath the spray tool 11. After completion of the cleaning process, the cover of spray tool 11 is closed. Subsequently, the wafer treatment process in the spray tool can be resumed.

We claim:

1. An exhaust apparatus for a treatment unit for treating electrical components including wafers, the exhaust apparatus removing by at least one of suction and rinsing, particles located in the treatment unit, the exhaust apparatus comprising:
    a main exhaust pipe having an outside pipe and an inside pipe, said inside pipe having a number of nozzles formed therein;
    a side pipe having an outside pipe, an inside pipe with a number of nozzles formed therein, a first end to be connected to the treatment unit, and a second end connected to said main exhaust pipe; and
    a storage tank containing a cleaning fluid connected to said inside pipe of said main exhaust pipe and said inside pipe of said side pipe such that the cleaning fluid at least intermittently flows through said inside pipe of said main exhaust pipe and said inside pipe of said side pipe.

2. The exhaust apparatus according to claim 1, wherein said, outside pipe of said side pipe has a diameter of 90 mm and said inside pipe of said side pipe has a diameter of 20 mm.

3. The exhaust apparatus according to claim 1, wherein said side pipe is formed by at least two sections and said sections are aligned at an angle with respect to each other.

4. The exhaust apparatus according to claim 3, wherein said sections are aligned with respect to each other at an angle of between 135° and 155°.

5. The exhaust apparatus according to claim 3, wherein said sections are aligned with respect to each other at an angle of between 140° and 145°.

6. The exhaust apparatus according to claim 3, wherein said sections are aligned with respect to each other at an angle of 142°30'.

7. The exhaust apparatus according to claim 3, including an extension element connected to one of said sections being an edge-side partial area of said side pipe.

8. The exhaust apparatus according to claim 1, wherein said inside pipe of said main exhaust pipe has a diameter of 25 mm.

9. The exhaust apparatus according to claim 1, wherein said main exhaust pipe and said side pipe are connected with each other at an angle of 25° to 40°.

10. The exhaust apparatus according to claim 1, wherein said main exhaust pipe and said side pipe are connected with each other at an angle of 30°.

11. The exhaust apparatus according to claim 1, including an additional exhaust pipe having a first end connected to said main exhaust pipe and a second end to be connected to a clean room.

12. The exhaust apparatus according to claim 11, wherein said side pipe and said additional exhaust pipe are made of polyvinylidene fluoride (PVDF) plastic.

13. The exhaust apparatus according to claim 11, wherein said side pipe and said additional exhaust pipe are made of a chemically inert plastic.

14. The exhaust apparatus according to claim 1, including a gas scrubber connected to said main exhaust pipe.

15. The exhaust apparatus according to claim 1, wherein said nozzles of said main exhaust pipe and said side pipe are spaced 5 to 20 cm apart.

16. The exhaust apparatus according to claim 1, wherein each of said nozzles of said main exhaust pipe and said side pipe have 1 to 10 nozzle openings formed therein and said nozzle openings are distributed across a circumference of said inside pipe of said main exhaust pipe and said inside pipe of said side pipe.

17. The exhaust apparatus according to claim 1, wherein said inside pipe of said main exhaust pipe and said inside pipe of said side pipe each have 10 to 15 of said nozzles.

18. The exhaust apparatus according to claim 1, wherein said inside pipe of said main exhaust pipe and said inside pipe of said side pipe each have 11 of said nozzles.

19. The exhaust apparatus according to claim 1, wherein said main exhaust pipe is made of polyvinyl chloride (PVC) plastic.

20. The exhaust apparatus according to claim 1, wherein said main exhaust pipe is made of plastic.

21. The exhaust apparatus according to claim 1, wherein the cleaning fluid is water selected from the group consisting of deionized water and demineralized water.

22. The exhaust apparatus according to claim 21, wherein the water is mixed with a wetting agent.

23. An exhaust apparatus for a treatment unit having a spray tool for cleaning electrical components including wafers, the exhaust apparatus removing by at least one of suction and rinsing, particles located in the treatment unit, the exhaust apparatus comprising:
   a main exhaust pipe having an outside pipe and an inside pipe, said inside pipe having a number of nozzles formed therein;
   a side pipe having an outside pipe, an inside pipe with a number of nozzles formed therein, a first end to be connected to the treatment unit, and a second end connected to said main exhaust pipe; and
   a storage tank containing a cleaning fluid connected to said inside pipe of said main exhaust pipe and said inside pipe of said side pipe such that the cleaning fluid at least intermittently flows through said inside pipe of said main exhaust pipe and said inside pipe of said side pipe.

24. A system for treating electrical components including wafers, comprising:
   at least one treatment unit receiving and treating the electrical components; and
   an exhaust apparatus for removing by at least one of suction and rinsing, particles located in said treatment unit, said exhaust apparatus including:
      a main exhaust pipe having an outside pipe and an inside pipe, said inside pipe having a number of nozzles formed therein;
      a side pipe having an outside pipe, an inside pipe with a number of nozzles formed therein, a first end to be connected to the treatment unit, and a second end connected to said main exhaust pipe; and
      a storage tank containing a cleaning fluid connected to said inside pipe of said main exhaust pipe and said inside pipe of said side pipe such that the cleaning fluid at least intermittently flows through said inside pipe of said main exhaust pipe and said inside pipe of said side pipe.

25. The system according to claim 24, including a clean room housing said treatment unit, and said exhaust apparatus is provided outside of said clean room.

26. The system according to claim 24, wherein said exhaust apparatus has an additional exhaust pipe connecting said main exhaust pipe to said clean room.

27. The system according to claim 24, including a chimney connected to said main exhaust pipe.

28. The system according to claim 27, including a gas scrubber disposed between said chimney and said main exhaust pipe.

29. The system according to claim 27, including an additional separate exhaust line for connecting said treatment unit directly to said chimney.

30. The system according to claim 24, including a motor for assisting in providing a suction in said main exhaust pipe and said side pipe.

31. The system according to claim 24, including 5 to 10 deionizers, disposed 1 to 20 cm apart from one another and at a height of 0.5 to 5 m above said treatment unit, for compensating for electrostatic charging.

32. The system according to claim 31, wherein said deionizers are disposed 10 cm apart from one another and at the height of 1.5 m.

33. The system according to claim 24, wherein said treatment unit is used to clean the wafers of particles greater than or equal to 0.16 $\mu$m in diameter.

34. A system for treating electrical components including wafers, comprising:
   at least one treatment unit receiving and treating the electrical components, said treatment unit having at least one spray tool for cleaning the electrical components; and
   an exhaust apparatus for removing by at least one of suction and rinsing, particles located in said treatment unit, said exhaust apparatus including:
      a main exhaust pipe having an outside pipe and an inside pipe, said inside pipe having a number of nozzles formed therein;
      a side pipe having an outside pipe, an inside pipe with a number of nozzles formed therein, a first end to be connected to the treatment unit, and a second end connected to said main exhaust pipe; and
      a storage tank containing a cleaning fluid connected to said inside pipe of said main exhaust pipe and said inside pipe of said side pipe such that the cleaning fluid at least intermittently flows through said inside pipe of said main exhaust pipe and said inside pipe of said side pipe.

* * * * *